(12) United States Patent
Jin et al.

(10) Patent No.: US 11,051,411 B2
(45) Date of Patent: Jun. 29, 2021

(54) MOBILE ELECTRONIC DEVICE AND DISPLAY THEREOF

(71) Applicant: TCL Communications (Ningbo) Co., Ltd., Ningbo (CN)

(72) Inventors: Xiulu Jin, Ningbo (CN); Yanwen Chen, Ningbo (CN); Hongjie Tong, Ningbo (CN); Linfang Li, Ningbo (CN)

(73) Assignee: TCL COMMUNICATIONS (NINGBO) CO., LTD., Ningbo (CN)

( * ) Notice: Subject to any disclaimer, the term of this patent is extended or adjusted under 35 U.S.C. 154(b) by 0 days.

(21) Appl. No.: 16/617,472

(22) PCT Filed: May 25, 2018

(86) PCT No.: PCT/CN2018/088426
§ 371 (c)(1),
(2) Date: Nov. 26, 2019

(87) PCT Pub. No.: WO2018/219225
PCT Pub. Date: Dec. 6, 2018

(65) Prior Publication Data
US 2020/0163232 A1 May 21, 2020

(30) Foreign Application Priority Data
May 27, 2017 (CN) .......................... 201710391157.5

(51) Int. Cl.
*H05K 5/00* (2006.01)
*H05B 33/04* (2006.01)
*H05B 33/06* (2006.01)
*H05K 1/18* (2006.01)

(52) U.S. Cl.
CPC .......... *H05K 5/0017* (2013.01); *H05B 33/04* (2013.01); *H05B 33/06* (2013.01); *H05K 1/18* (2013.01); *H05K 2201/10128* (2013.01)

(58) Field of Classification Search
None
See application file for complete search history.

(56) References Cited

U.S. PATENT DOCUMENTS

| | | | |
|---|---|---|---|
| 7,045,955 | B2 | 5/2006 | Seo et al. |
| 7,764,014 | B2 | 7/2010 | Yoshida et al. |
| 7,839,086 | B2 | 11/2010 | Kim et al. |
| 9,147,721 | B2 | 9/2015 | Hong |
| 2004/0027061 | A1 | 2/2004 | Seo et al. |
| 2008/0088231 | A1 | 4/2008 | Kim et al. |

(Continued)

FOREIGN PATENT DOCUMENTS

| | | |
|---|---|---|
| CN | 1474637 A | 2/2004 |
| CN | 101162727 A | 4/2008 |

(Continued)

*Primary Examiner* — Ashok Patel
(74) *Attorney, Agent, or Firm* — Kirton McConkie; Evan R. Witt

(57) ABSTRACT

A display includes display region and a non-display region surrounding the display region. The display further includes a main circuit board, wherein an electroluminescent film layer is coated in the non-display region, and the electroluminescent film layer is electrically connected with the main circuit board. A periphery of the display region is illuminated by the electroluminescent film layer disposed at the non-display region of the display.

18 Claims, 2 Drawing Sheets

(56) References Cited

U.S. PATENT DOCUMENTS

| | | | |
|---|---|---|---|
| 2009/0284135 A1 | 11/2009 | Yoshida et al. | |
| 2012/0056859 A1* | 3/2012 | Chen | H05K 1/028 345/204 |
| 2013/0135877 A1* | 5/2013 | Oh | H04M 1/0266 362/362 |
| 2013/0335461 A1 | 12/2013 | Rekimoto | |
| 2014/0140019 A1* | 5/2014 | Park | H05K 3/361 361/749 |
| 2015/0115234 A1 | 4/2015 | Hong | |
| 2016/0188073 A1 | 6/2016 | Ren | |
| 2019/0305070 A1* | 10/2019 | Lee | H05K 3/323 |
| 2020/0028114 A1* | 1/2020 | Zhai | G09F 9/301 |

FOREIGN PATENT DOCUMENTS

| | | |
|---|---|---|
| CN | 101543136 A | 9/2009 |
| CN | 104503639 A | 4/2015 |
| CN | 104576685 A | 4/2015 |
| CN | 204257140 U | 4/2015 |
| CN | 102681255 B | 5/2015 |
| CN | 107066051 A | 8/2017 |

\* cited by examiner

MOBILE ELECTRONIC DEVICE AND DISPLAY THEREOF

CROSS REFERENCE

This application is a National Stage of International Application No. PCT/CN2018/088426, filed May 25, 2018, titled "MOBILE ELECTRONIC DEVICE AND DISPLAY THEREOF", which claims priority to Chinese Application No. 201710391157.5, filed on May 27, 2017. The entire disclosures of each of the applications are incorporated herein by reference.

FIELD OF INVENTION

The present invention relates to a field of electronic device technology, and more particularly to a mobile electronic device and a display thereof.

BACKGROUND OF INVENTION

Currently, due to mobile electronic devices, such as mobile phones and tablets on the market, need to cover wiring of the display with black ink, where a black frame is formed on the periphery of a display region of the display. The black frame not only reduces a screen-to-body ratio of the display region, but also influences appearance of the mobile electronic device. The black frame does not meet the development trend that users pursue a higher visual experience, a larger display region of the device, and a higher screen-to-body ratio.

Therefore, it needs to provide a solution to resolve the above problem of the black frame.

SUMMARY OF INVENTION

The embodiment of the present invention provides a mobile electronic device and a display thereof. The above problem is resolved by providing an electroluminescent film layer at a non-display region of the display to illuminate a periphery of a display region.

First aspect, the embodiment of the present invention provides a display, comprising a display region and a non-display region surrounding the display region, wherein the display further comprises a main circuit board, an electroluminescent film layer is coated in the non-display region, and the electroluminescent film layer is electrically connected with the main circuit board.

Preferably, the display further comprises a display panel and a glass cover, wherein the electroluminescent film layer is located between the display panel and the glass cover, and the electroluminescent film layer comprises a first conductive layer, an electroluminescent layer, and a second conductive layer disposed on the display panel in sequence.

Preferably, a material of the first conductive layer is silver paste, and a material of the second conductive layer is indium tin oxide (ITO). The silver paste and ITO have good conductive conductivity, and the ITO has high light transmittance that is favorited for the light generated by the electroluminescent layer to be emitted out through the second conductive layer.

Preferably, the first conductive layer, the electroluminescent layer, and the second conductive layer are formed by a printing process. A thickness of the electroluminescent film layer may be maintained at a small size by using the printing process to prepare each structure of the electroluminescent film layer, it nearly no influence on the thickness of the mobile electronic device, so that the mobile electronic device may be kept light and thin.

Preferably, a first insulation layer is disposed between the first conductive layer and the display panel, and a second insulation layer is disposed between the second conductive layer and the glass cover, wherein the first insulation layer and the second insulation layer are used to protect the first conductive layer, the electroluminescent layer, and the second conductive layer inside the electroluminescent film layer.

Preferably, a material of the first insulation layer is insulation varnish, and a material of the second insulation layer is optical clear adhesive (OCA). The OCA has high light transmittance that is favorited for the light generated by the electroluminescent layer to be emitted out through the second insulation layer.

Preferably, a white ink layer is disposed between the second insulation layer and the glass cover, wherein the white ink layer is used to block the color of the electroluminescent layer while the electroluminescent film layer stops illuminating, and serves as a light guide to concentrate the light to a surrounding region of the display area.

Preferably, the electroluminescent film layer is provided with an avoidance area for exposing a virtual button, a camera hole and an earphone hole of the display.

Preferably, one end of the electroluminescent film layer is provided with a first electrode pair, another end of the electroluminescent film layer is provided with a second electrode pair, and the electroluminescent film layer is electrically connected with the main circuit board by the first electrode pair and the second electrode pair. By providing electrode pairs at opposite two ends of the electroluminescent film layer, it is possible to prevent the impedance of the electroluminescent film layer on both sides of the mobile electronic device from being excessively large, resulting in uneven illumination.

Second aspect, the embodiment of the present invention provides a mobile electronic device, comprising a display, wherein the display comprises a display region and a non-display region surrounding the display region, the display further comprises a main circuit board, an electroluminescent film layer is coated in the non-display region, and the electroluminescent film layer is electrically connected with the main circuit board.

Preferably, the display comprises a display panel and a glass cover, the electroluminescent film layer is located between the display panel and the glass cover, and the electroluminescent film layer comprises a first conductive layer, an electroluminescent layer, and a second conductive layer disposed on the display panel in sequence.

Preferably, a material of the first conductive layer is silver paste, and a material of the second conductive layer is indium tin oxide (ITO).

Preferably, the first conductive layer, the electroluminescent layer and the second conductive layer are formed by a printing process.

Preferably, a first insulation layer is disposed between the first conductive layer and the display panel, and a second insulation layer is disposed between the second conductive layer and the glass cover.

Preferably, a material of the first insulation layer is insulation varnish, and a material of the second insulation layer is optical clear adhesive (OCA).

Preferably, a white ink layer is disposed between the second insulation layer and the glass cover.

Preferably, the electroluminescent film layer is provided with an avoidance area for exposing a virtual button, a camera hole and an earphone hole of the display.

Preferably, one end of the electroluminescent film layer is provided with a first electrode pair, another end of the electroluminescent film layer is provided with a second electrode pair, and the electroluminescent film layer is electrically connected with the main circuit board by the first electrode pair and the second electrode pair.

Third aspect, the embodiment of the present invention provides a display, comprising a display region and a non-display region surrounding the display region, wherein the display further comprises a main circuit board, an electroluminescent film layer is coated in the non-display region, the electroluminescent film layer is electrically connected with the main circuit board, and a thickness of the electroluminescent film layer is less than 0.1 mm;

wherein the display further comprises a display panel and a glass cover, the electroluminescent film layer is located between the display panel and the glass cover, and the electroluminescent film layer comprises a first conductive layer, an electroluminescent layer, and a second conductive layer disposed on the display panel in sequence.

Preferably, the electroluminescent film layer located at one end of a virtual button is provided with a first electrode pair, the electroluminescent film layer located at another end of a camera hole and an earphone hole is provided with a second electrode pair, and the electroluminescent film layer is connected with the main circuit board by the first electrode pair and the second electrode pair.

The embodiment of the present invention provides a mobile electronic device and a display thereof, a periphery of the display region is illuminated by the electroluminescent film layer disposed at the non-display region of the display, thereby reducing and even taking away a black frame produced by the display, increasing a screen-to-body ratio of a mobile electronic device, and improving a user experiment.

DETAILED DESCRIPTION OF PREFERRED EMBODIMENTS

Figure 1:
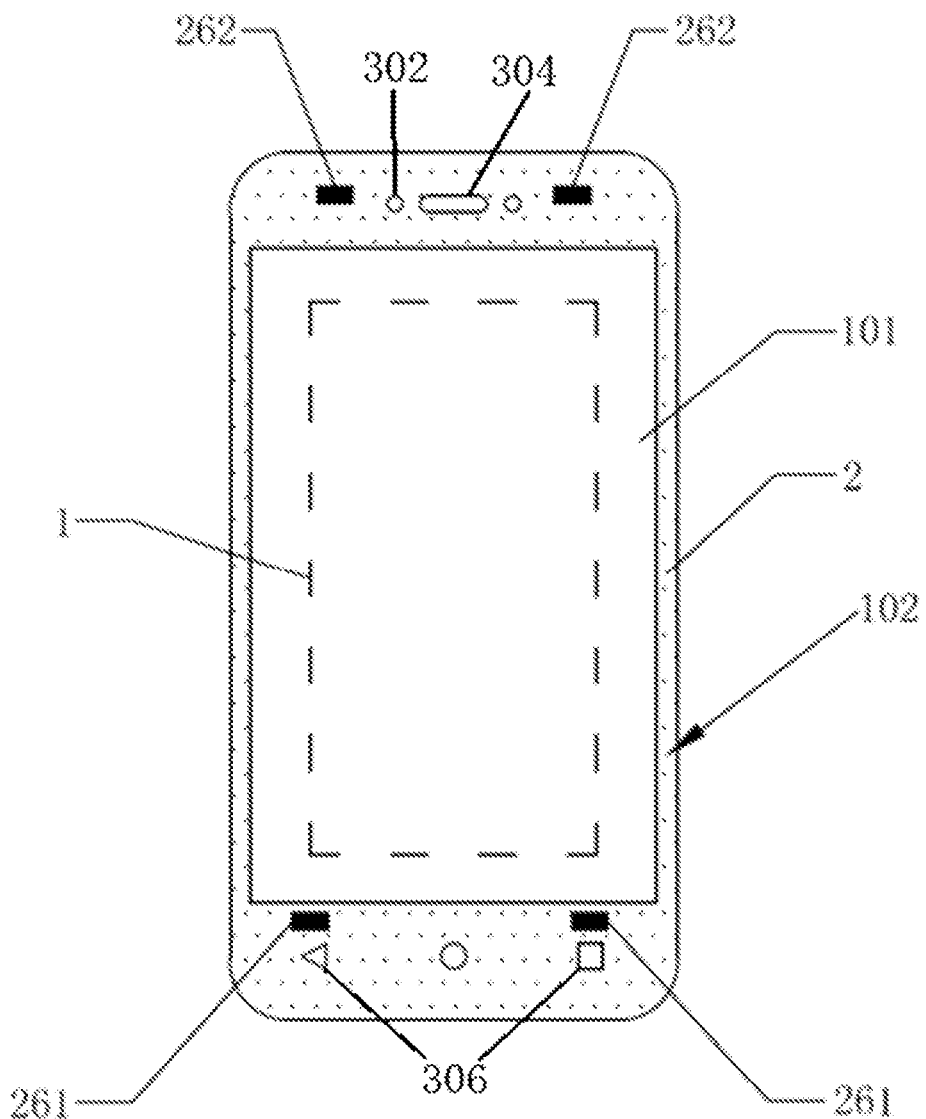
FIG. 1 is a schematic structural diagram showing a mobile electronic device according to the embodiment of the present invention.

In order to make objects, technical solutions, and advantages of the present invention clearer, the specific embodiments of the present invention will be described in detail below in accompany with drawings. Examples of preferred embodiments are illustrated in the drawings. The embodiments of the present invention illustrated in the drawings and described according to the drawings are merely exemplary, and the present invention is not limited to theses embodiments.

Here, it should be also noted that, in order to avoid obscuring the present invention by unnecessary details, only structures and/or process steps that closely related to the solutions according to the present invention are shown in the drawings, other details that are not relevant are omitted.

Figure 2:
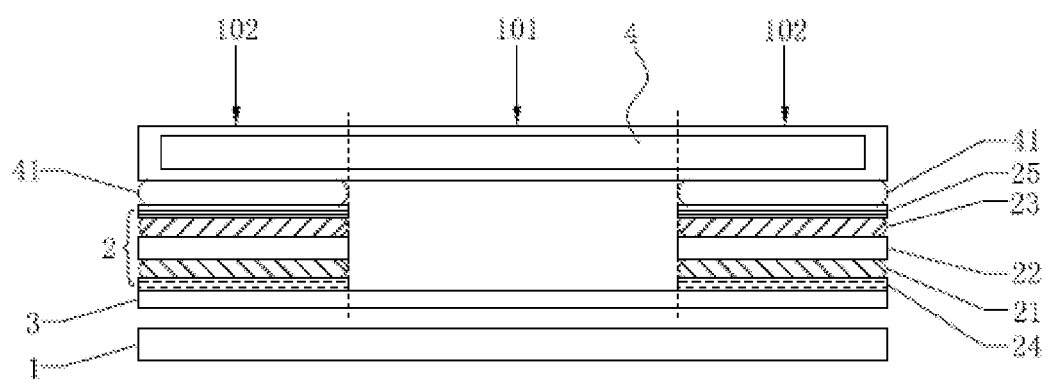
FIG. 2 is a schematic structural diagram showing a display according to the embodiment of the present invention.

Refer to FIG. 1 and FIG. 2, the embodiment of the present invention provides a mobile electronic device, as shown in FIG. 1, the mobile electronic device includes a display, the display includes a display region 101 and a non-display region 102 surrounding the display region 101, the display further includes a main circuit board 1. It should be noted that the dotted-line frame in FIG. 1 represents that the main circuit board 1 is disposed inside the mobile electronic device.

In the present embodiment, as shown in FIG. 2, an electroluminescent film layer 2 is coated in the non-display region 102, and the electroluminescent film layer 2 is electrically connected with the main circuit board 1. The main circuit board 1 is configured to drive the electroluminescent film layer 2, and the electroluminescent film layer 2 is configured to illuminated a periphery of the display region 101, thereby realizing a purpose of reducing and even taking away a black frame produced by the display.

Specifically, the display includes a display panel 3 and a glass cover 4, the electroluminescent film layer 2 is located between the display panel 3 and the glass cover 4. The electroluminescent film layer 2 includes a first conductive layer 21, an electroluminescent layer 22, and a second conductive layer 23 disposed on the display panel 3 in sequence. The electroluminescent material is the material that directly converts electrical energy into light energy by excitation of current and an electric field under action of a direct current (DC) electric field or an alternating current (AC) electric field. In the present embodiment, the electroluminescent layer 22 made of the electroluminescent material is applied to the electroluminescent film layer 2 and used as a light source of the electroluminescent film layer 2. The electroluminescent layer 22 has advantages of uniform light distribution, low power consumption, and uniform heat generation. In the present embodiment, according to actual needs, the electroluminescent layer 22 may be composed of the electroluminescent material with different color, or be formed in different patterns to be disposed between the display panel 3 and the glass cover 4.

Further, a first insulation layer 24 is disposed between the first conductive layer 21 and the display panel 3, and a second insulation layer 25 is disposed between the second conductive layer 23 and the glass cover 4. The first insulation layer 24 and the second insulation layer 25 disposed on the electroluminescent film layer 2 are used to protect the first conductive layer 21, the electroluminescent layer 22, and the second conductive layer 23 inside the electroluminescent film layer 2.

Furthermore, a white ink layer 41 is disposed between the second insulation layer 25 and the glass cover 4. In the present embodiment, the white ink layer 41 is used to block the color of the electroluminescent layer 22 while the electroluminescent film layer 2 stops working, and serves as a light guide to concentrate the light to a surrounding region of the display area 101, thereby improving the effect that the electroluminescent film layer 2 takes away the black frame produced by the display.

In the present embodiment, the first conductive layer 21, the electroluminescent layer 22, and the second conductive layer 23 are formed by a printing process. A thickness of the electroluminescent film layer 2 may be maintained at a small size by using the printing process to prepare the structure of the electroluminescent film layer 2, it has nearly no influence on the thickness of the mobile electronic device, so that the mobile electronic device may be kept light and thin. In the present embodiment, a thickness of the electroluminescent film layer 2 may be 0.1 mm or less.

Exemplary, in the present embodiment, a material of the first conductive layer 21 is silver paste, and a material of the second conductive layer 23 is indium tin oxide (ITO). The silver paste material used in the first conductive layer 21 is a viscous slurry of a mechanical mixture composed of high-purity metallic silver particles, a binder, a solvent, and an auxiliary agent, it has good electrical conductivity and is suitable to serve as the conductive layer of the present embodiment. Since the second conductive layer 23 is disposed above the electroluminescent layer 22, it is required to use a material with good conductivity and high light transmittance, so that the light from the electroluminescent layer 22 can be emitted out through the second conductive layer 23. Exemplary, the ITO used in the second conductive layer 23 of the present embodiment has good electrical conductivity and high light transmittance that is favored for the light generated by the electroluminescent layer 22 to be emitted out through the second conductive layer 23.

Exemplary, a material of the first insulation layer 24 is insulation varnish coated on a surface of the first conductive layer, and a material of the second insulation layer 25 is optical clear adhesive (OCA) disposed on the second conductive layer 23. Similarly, since the second insulation layer 25 is disposed on the electroluminescent layer 22, it is required to use a material with good insulation property and high light transmittance, so that the light from the electroluminescent layer 22 can be emitted out through the second insulation layer 25, the OCA used in the second insulation layer 25 has high light transmittance and good insulation property that is favored for the light generated by the electroluminescent layer 22 to be emitted out through the second insulation layer 25.

Further, the electroluminescent film layer 2 is provided with an avoidance area for exposing a virtual button 306, a camera hole 302, and an earphone hole 304 of the display to prevent the electroluminescent film layer 2 from affecting the operation of the above devices.

As shown in FIG. 1, furthermore, one end of the electroluminescent film layer 2 is provided with a first electrode pair 261, another end of the electroluminescent film layer 2 is provided with a second electrode pair 262, and the electroluminescent film layer 2 is electrically connected with the main circuit board 1 by the first electrode pair 261 and the second electrode pair 262. In the present embodiment, the electroluminescent film layer 2 has one end adjacent to a virtual button 306 provided with the first electrode pair 261, and the electroluminescent film layer 2 has another end adjacent to a camera hole 302 and an earphone hole 304 provided with a second electrode pair 262. By providing the first electrode pair 261 and the second electrode pair 262, it is possible to prevent the impedance of the electroluminescent film layer 2 on both sides of the mobile electronic device from being excessively large, resulting in uneven illumination.

Specifically, the first electrode pair 261 and the second electrode pair 262 are silver pads or copper pads. The first electrode pair 261 and the second electrode pair 262 are respectively connected with the main circuit board 1 through conductive foam or conductive cloth. The silver paste and the metallic copper material used above have good electrical conductivity, it is suitable to serve as electrodes of the electroluminescent film layer 2. The conductive cloth and the conductive foam also have the good electrical conductivity and flexibility, it is very suitable for electrical connection.

Above all, the mobile electronic device and the display thereof provided by the embodiment of the present invention, a periphery of the display region 101 is illuminated by the electroluminescent film layer 2 disposed at the non-display region 102 of the display, thereby reducing and even taking away the black frame produced by the display, increasing a screen-to-body ratio of the mobile electronic device, and improving a user experiment.

It should be noted that, in the content, relational terms such as "first" and "second" are used merely to distinguish one entity or operation from another entity or operation, and do not necessarily require or imply any such actual relationship or order between the entities or operations. Furthermore, the term "comprises" or "include" or any other variations thereof is intended to encompass a non-exclusive inclusion, so that a process, method, subject, or device including a series of elements includes not only those elements but also other elements not specifically listed, or inherent elements of the process, method, item, or device. Under a situation without more limitations, an element that is defined by the phrase "comprising a . . . " does not exclude the presence of additional equivalent elements in the process, method, subject, or device that includes the elements.

The above description is only a specific embodiment of the present application. It should be noted that, for persons skilled in this art, various modifications and alterations can be made without departing from the principles of the present application, and it should be considered as a protection scope of the present application.

What is claimed is:

1. A display, comprising: a glass cover, an electroluminescent film layer, a display panel, and a main circuit board disposed to define a display region and a non-display region surrounding the display region, wherein the electroluminescent film layer is located between the display panel and the glass cover, coated in the non-display region, and electrically connected with the main circuit board.

2. The display as claimed in claim 1, wherein the electroluminescent film layer comprises a first conductive layer, an electroluminescent layer, and a second conductive layer disposed on the display panel in sequence.

3. The display as claimed in claim 2, wherein a material of the first conductive layer is silver paste, and a material of the second conductive layer is indium tin oxide (ITO).

4. The display as claimed in claim 2, wherein the electroluminescent film layer further comprises a first insulation layer disposed between the first conductive layer and the display panel, and a second insulation layer disposed between the second conductive layer and the glass cover.

5. The display as claimed in claim 4, wherein a material of the first insulation layer is insulation varnish, and a material of the second insulation layer is optical clear adhesive (OCA).

6. The display as claimed in claim 4, further comprising a white ink layer disposed between the second insulation layer and the glass cover.

7. The display as claimed in claim 1, wherein one end of the electroluminescent film layer is provided with a first electrode pair, another end of the electroluminescent film layer is provided with a second electrode pair, and the electroluminescent film layer is electrically connected with the main circuit board by the first electrode pair and the second electrode pair.

8. The display as claimed in claim 1, wherein the display comprises a virtual button, a camera hole, and an earphone hole, and the electroluminescent film layer is provided with an avoidance area for exposing the virtual button, the camera hole and the earphone hole of the display.

9. A mobile electronic device, comprising a display, wherein the display comprises a glass cover, an electroluminescent film layer, a display panel, and a main circuit board disposed to define a display region and a non-display region surrounding the display region, the electroluminescent film layer is located between the display panel and the glass cover, coated in the non-display region, and electrically connected with the main circuit board.

10. The mobile electronic device as claimed in claim 9, wherein one end of the electroluminescent film layer is provided with a first electrode pair, another end of the electroluminescent film layer is provided with a second electrode pair, and the electroluminescent film layer is electrically connected with the main circuit board by the first electrode pair and the second electrode pair.

11. The mobile electronic device as claimed in claim 9, wherein the electroluminescent film layer comprises a first conductive layer, an electroluminescent layer, and a second conductive layer disposed on the display panel in sequence.

12. The mobile electronic device as claimed in claim 11, wherein a material of the first conductive layer is silver paste, and a material of the second conductive layer is indium tin oxide (ITO).

13. The mobile electronic device as claimed in claim 11, wherein the electroluminescent film layer further comprises a first insulation layer disposed between the first conductive layer and the display panel, and a second insulation layer disposed between the second conductive layer and the glass cover.

14. The mobile electronic device as claimed in claim 13, wherein a material of the first insulation layer is insulation varnish, and a material of the second insulation layer is optical clear adhesive (OCA).

15. The mobile electronic device as claimed in claim 13, wherein the display further comprises a white ink layer disposed between the second insulation layer and the glass cover.

16. The mobile electronic device as claimed in claim 9, wherein the display comprises a virtual button, a camera hole, and an earphone hole, and the electroluminescent film layer is provided with an avoidance area for exposing the virtual button, the camera hole and the earphone hole of the display.

17. A display, comprising a display region a non-display region surrounding the display region, a main circuit board, an electroluminescent film layer coated in the non-display region and electrically connected with the main circuit board, wherein a thickness of the electroluminescent film layer is less than 0.1 mm;

wherein the display further comprises a display panel and a glass cover, the electroluminescent film layer is located between the display panel and the glass cover, and the electroluminescent film layer comprises a first conductive layer, an electroluminescent layer, and a second conductive layer disposed on the display panel in sequence.

18. The display as claimed in claim 17, further comprising a virtual button, a camera hole, and an earphone hole, wherein the electroluminescent film layer has one end adjacent to the virtual button provided with a first electrode pair, the electroluminescent film layer has another end adjacent to the camera hole and the earphone hole provided with a second electrode pair, and the electroluminescent film layer is connected with the main circuit board by the first electrode pair and the second electrode pair.

* * * * *